(12) United States Patent
Caccia et al.

(10) Patent No.: US 7,582,875 B2
(45) Date of Patent: Sep. 1, 2009

(54) MONOLITHIC ACTIVE PIXEL DOSIMETER

(75) Inventors: Massimo Caccia, c/o Università degli Studi dell'Insubria, Dipartimento di Scienze CC.FF.MM., Via Valleggio, 11, 22100 Como (IT); Leopoldo Conte, c/o Università degli Studi dell'Insubria, Dipartimento di Scienze Cliniche e Biologiche, Padiglione Antonini, Via Ottorino Ross, 9, 21100 Varese (IT); Mario Alemi, Como (IT); Chiara Cappellini, Como (IT); Antonello Luigi Airoldi, Olgiate Molgora (IT); Carla Bianchi, Varese (IT); Raffaele Novario, Varese (IT); Wim De Boer, Karlsruhe (DE); Eugene Grigoriev, Karlsruhe (DE); Halina Niemiec, Cracow (PL); Wojciech Kucewicz, Cracow (PL); Francesco Cannillo, Strasbourg (FR); Gilles Clauss, Strasbourg (FR); Claude Colledani, Strasbourg (FR); Grzegorz Deptuch, Strasbourg (FR); Wojciech Dulinski, Strasbourg (FR); Piotr Grabiec, Warsaw (PL); Jacek Marczewski, Warsaw (PL); Krzysztof Domanski, Warsaw (PL); Bohdan Jaroszewicz, Warsaw (PL); Krzysztof Kucharski, Warsaw (PL); Laura Badano, Milan (IT); Ornella Ferrando, Milan (IT); Georg Popowski, Geneva (CH); Agnieszka Zalewska, Cracow (PL); Adam Czermak, Cracow (PL)

(73) Assignees: Universitaet Karlsruhe., Karlsruhe (DE); Akademia Gorniczo-Hutnicza, Crakow (PL); Université Louis Pasteur, Strasbourg (FR); Centre National de la Recherche Scientifique, Paris (FR); Institute of Electron Technology, Warsaw (PL); Fondazione per Adroterapia Oncologica - Tera, Novara (IT); Universite' de Geneve, Geneva (CH); Instytut Fizyki Jadrowej Im H Niewodniczanskiego, Crakow (PL); Massimo Caccia, Como (IT); Leopoldo Conte, Varese (IT)

( * ) Notice: Subject to any disclaimer, the term of this patent is extended or adjusted under 35 U.S.C. 154(b) by 654 days.

(21) Appl. No.: 11/123,708

(22) Filed: May 5, 2005

(65) Prior Publication Data

US 2006/0043313 A1 Mar. 2, 2006

(30) Foreign Application Priority Data

Nov. 5, 2002 (WO) .................... PCT/IT02/00700

(51) Int. Cl.
*G01T 1/02* (2006.01)
(52) U.S. Cl. .................................... 250/370.07
(58) Field of Classification Search ............. 250/484.5, 250/370.01, 370.07, 370.11, 370.14; 257/290, 257/461, E27.128, E27.129
See application file for complete search history.

(56) References Cited

U.S. PATENT DOCUMENTS

| | | | |
|---|---|---|---|
| 5,726,440 A * | 3/1998 | Kalkhoran et al. | 250/214.1 |
| 5,859,450 A | 1/1999 | Clark et al. | |
| 6,380,572 B1 | 4/2002 | Pain et al. | |
| 7,160,753 B2 * | 1/2007 | Williams, Jr. | 438/73 |
| 2002/0022309 A1 | 2/2002 | Dierickx | |
| 2002/0149078 A1 | 10/2002 | Hynecek | |

OTHER PUBLICATIONS

B. Dierickx, et al., "Integration of CMOS-electronics and particle detector diodes in high-resistivity silicon-on-insulator wafers", IEEE Transactions on Nuclear Science, vol. 40, No. 4, pp. 753-758, Aug. 1993.

El-Sayed Eid, "Design of Radiation Hard CMOS APA Image Sensors for Space Applications", Seventeenth National Radio Science Conference, Minufiya University, Egypt., Feb. 22-24, 2000.

Isao Takayanagi, et al., "A Low Dark Current Stacked CMOS-APS for Charged Particle Imaging", IEEE, 2001.

International Search Report for PCT/IT 02/00700 dated Jul. 21, 2003.

* cited by examiner

*Primary Examiner*—David P Porta
*Assistant Examiner*—Faye Boosalis
(74) *Attorney, Agent, or Firm*—Kevin D. Jablonski; Graybeal Jackson LLP

(57) ABSTRACT

A monolithic active pixel dosimeter, provided with at least a sensing cell, having at least a junction sensing element. The junction sensing element includes a sensing region, having a first type of conductivity, and a charge collecting region, contiguous to the sensing region and having a second type of conductivity. The sensing cell further includes an ohmic region at least partially overlapping and extending laterally outside the charge collecting region, and an annular insulating region, abutting the ohmic region, so as to form an insulating junction surrounding both the ohmic region and the charge collection region.

28 Claims, 7 Drawing Sheets

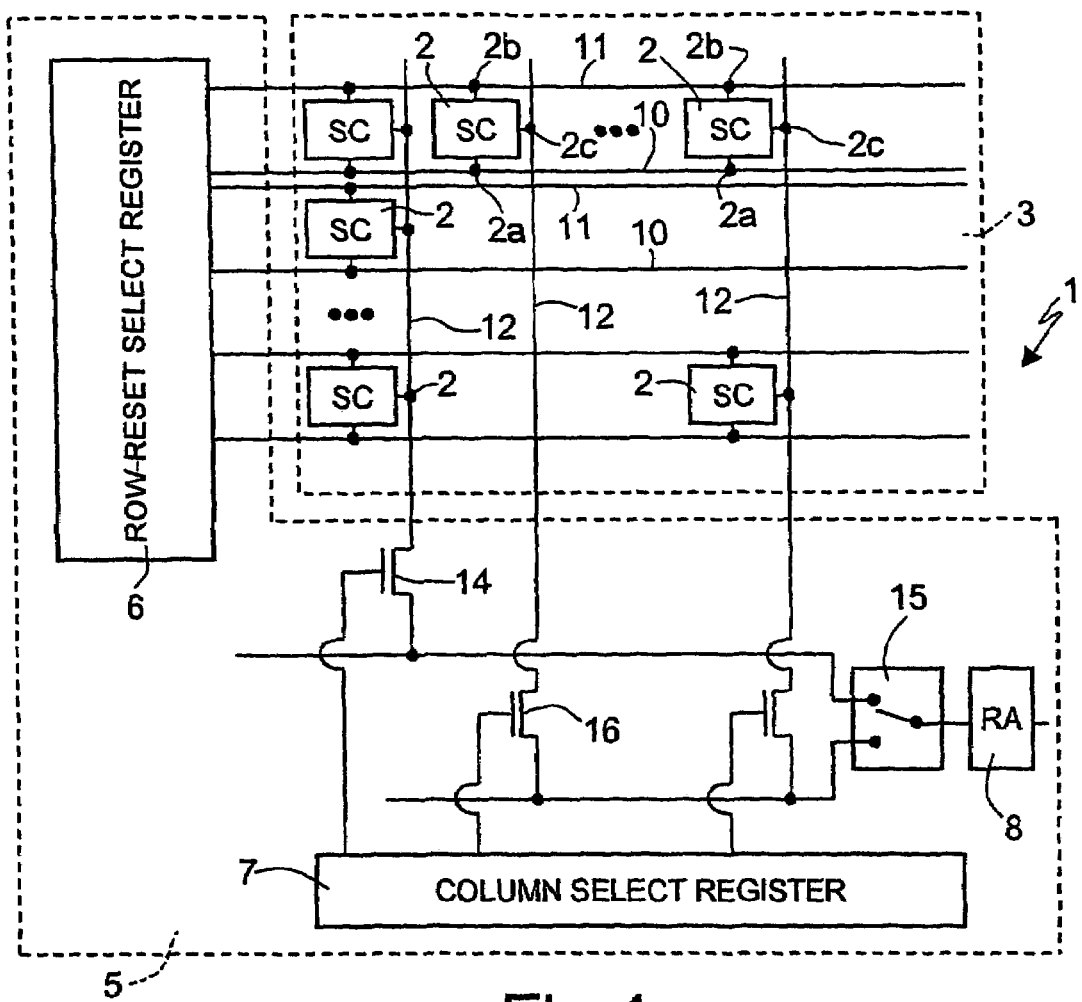
Fig.1
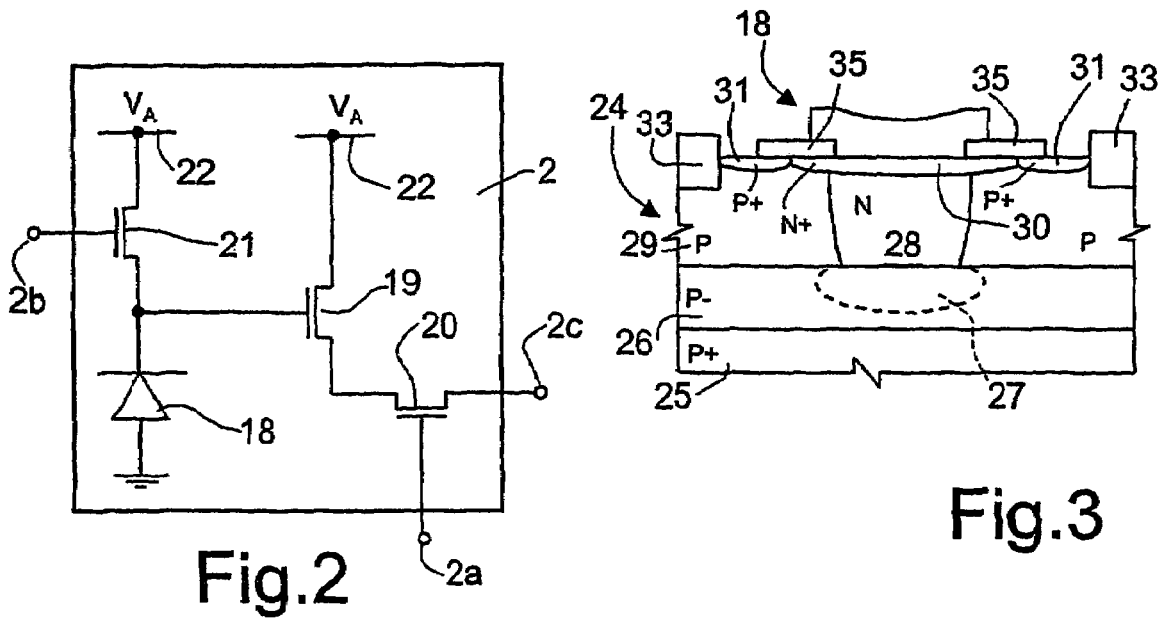
Fig.2
Fig.3

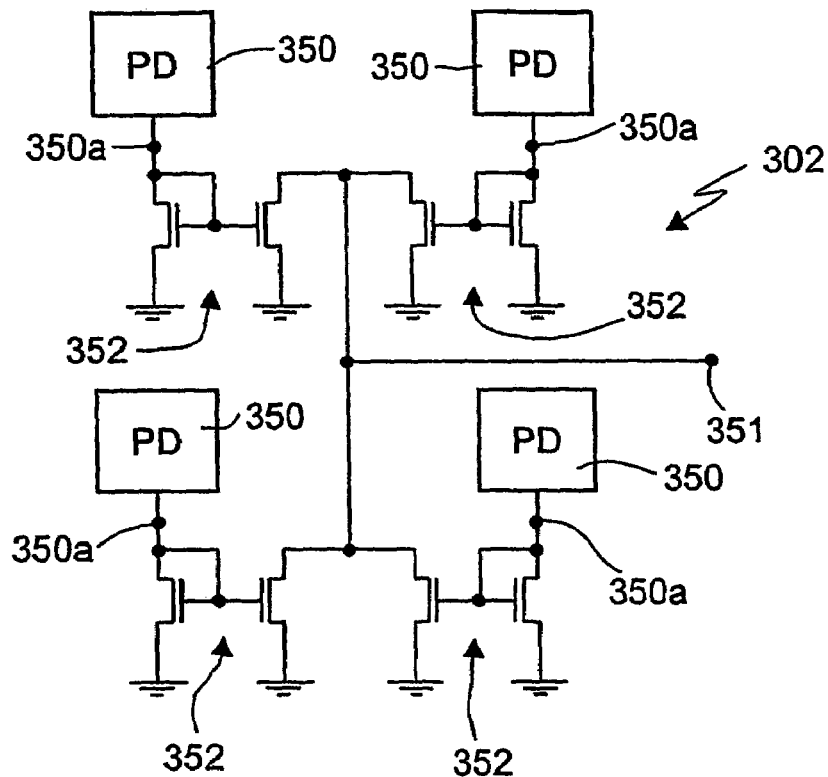
Fig.12
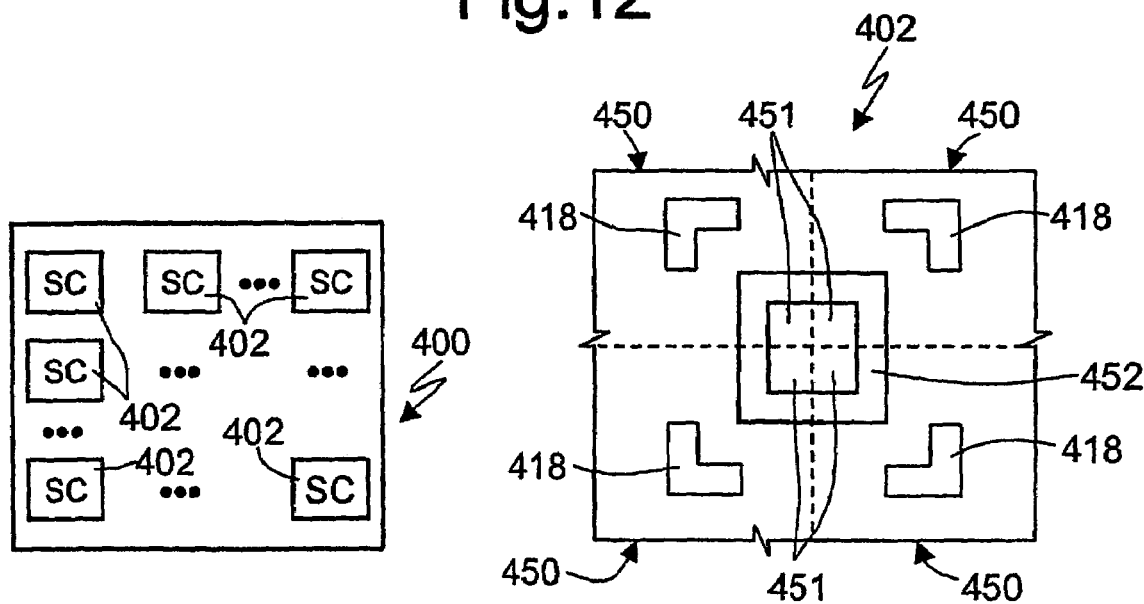
Fig.13
Fig.14

MONOLITHIC ACTIVE PIXEL DOSIMETER

PRIORITY CLAIM

This application claims priority from International patent application No. PCT/IT2002/000700, filed Nov. 5, 2002, which is incorporated herein by reference.

TECHNICAL FIELD

The present invention relates to a monolithic active pixel dosimeter.

BACKGROUND ART

The possibility of implementing an accurate real time dosimetry of elementary particle sources would be a remarkable progress in several important applications, such as radiotherapy.

For example, a branch of radiotherapy which would be significantly improved is brachytherapy. Coronary artery disease is the leading cause of morbidity and mortality in the western world. Re-establishing a stable and normal artery cross section (lumen) is the primary goal of angioplasty. On the other hand, re-narrowing of the cross section (restenosis) is the major limitation of angioplasty. Clinical studies indicate that intracoronary irradiation reduces substantially the problem of restenosis. It is estimated that the restenosis rate may drop from an original 30-40% below 10% if radiation is delivered to the obstruction site during or after angioplasty. The radiation treatment of an artery affected by restenosis (intravascular brachytherapy) is focused on a few centimeters long section of the vessel and it is usually accomplished either by multiple point-like radioactive sources placed on a catheter or by coil-shaped radioactive catheter tips or by wrapping with a radioactive foil the angioplasty balloon. During the radiation treatment the patient will have greatly reduced arterial blood flow, so, in order to reduce risks of complications, high dose rates are preferred; however, sources delivering dose rates of e.g. 5 Gy/min require monitoring of the activity uniformity.

Moreover, brachytherapy is characterized by steep dose gradients and three dimensional dose distributions, requiring high spatial resolution. A thorough understanding of the dosimetry of brachytherapy sources with high spatial resolution is important for addressing several key elements for the therapy optimization, including a full characterization of the interaction of radiation with vascular tissues, radiation penetration in different materials, dose profile inside the artery being treated and the definition of a treatment planning according to the vessel specifications. Moreover, a method and device for hospital based quality control of the sources would offer the possibility to improve the interventional safety conditions.

Real-time dosimetry could also improve safety conditions in oncological radiotherapy. Radiotherapic treatments based on X-rays are currently envisaged for 50% of patients affected by tumors. Among these, 30-40% are diagnosed as having a tumor or lesions that could benefit from irradiation with light ion beams. Approximately 250000 patients a year could benefit in Europe from a treatment with light ion beams; no better alternative exists for a sub-sample corresponding to 10% of the patients. The beam diagnostic systems of an hospital based accelerator for tumor radiotherapy is crucial as it determines an efficient and safe operation of the beam lines. A real time beam monitor could be based on the detection of electrons evaporated by the beam impinging on a thin target, appearing as an extended source of beta particles.

As of today, dosimetry, in particular of brachytherapy sources, is accomplished by two different classes of detectors with complementary features.

Passive detectors, namely radiochromic films not sensitive to visible light, feature a direct color change as a consequence of the energy deposition by elementary particles. The degree of environmental dependence of the radiochromic process can be accounted for in the calibration procedure and in the storage prescription; image scanning with a microdensitometer leads to a submillimetric resolution of the digitized image. The main drawback of radiochromic film dosimetry is the latency in the full image development; as a consequence of slow radiation induced chemical reactions, the American Association of Physicists in Medicine recommends the analysis of radiochromic films at least 24 h (preferably 48 h) after the exposure.

Active detectors feature a real time response to energy deposition by detecting scintillation light, gas ionization or through thermoluminescent effects. Calibration of the detector response guarantees the possibility to perform an accurate dosimetry in real time but the geometry of the detectors does not allow the reconstruction of accurate dose maps.

Only quite recently, customized CMOS imagers have been proven to be sensitive to charged particles and soft X-rays. The key element of existing CMOS particle detectors is the use of an n-well/p-epi diode, which is formed in an epitaxial layer grown on a substrate. More precisely, the diode collects through thermal diffusion the charge generated by particles impinging in the epitaxial layer.

However, in this case radiation tolerance should be improved, since known devices can be seriously damaged by high energy beams. In particular, thick oxide structures are required for insulating the n-well/p-epi diodes from the front-end circuitry. When exposed to a radiation beam, these thick oxide structures can capture charged particles, which are not subsequently released. Therefore, charge can be accumulated in the vicinity of the n-well/p-epi diodes, thus modifying electric field lines and efficiency is impaired.

DISCLOSURE OF THE INVENTION

The purpose of the present invention is therefore to provide a monolithic active pixel dosimeter that overcomes the limitations described above, and, in particular, is reliable, radiation tolerant and precise.

According to the present invention, a monolithic active pixel dosimeter is provided, as defined in claim 1.

BRIEF DESCRIPTION OF THE DRAWINGS

For a better understanding of the present invention, preferred embodiments thereof are now described, by way of non-limiting examples, with reference to the attached drawings, in which:

FIG. 1 is a simplified block diagram of a monolithic active pixel dosimeter, according to a first embodiment of the present invention;

FIG. 2 is a circuit diagram of a part of the block diagram of FIG. 1;

FIG. 3 is a cross section through a semiconductor body housing the dosimeter of FIG. 1;

FIG. 12 is a circuit diagram of a part of the block diagram of FIG. 10, according to a variation of the fourt embodiment of the invention;

FIG. 13 is a simplified block diagram of a monolithic active pixel dosimeter, according to a fifth embodiment of the present invention;

FIG. 14 is a top view of a part of the dosimeter of FIG. 13; and

BEST MODE FOR CARRYING OUT THE INVENTION

Figure 4:
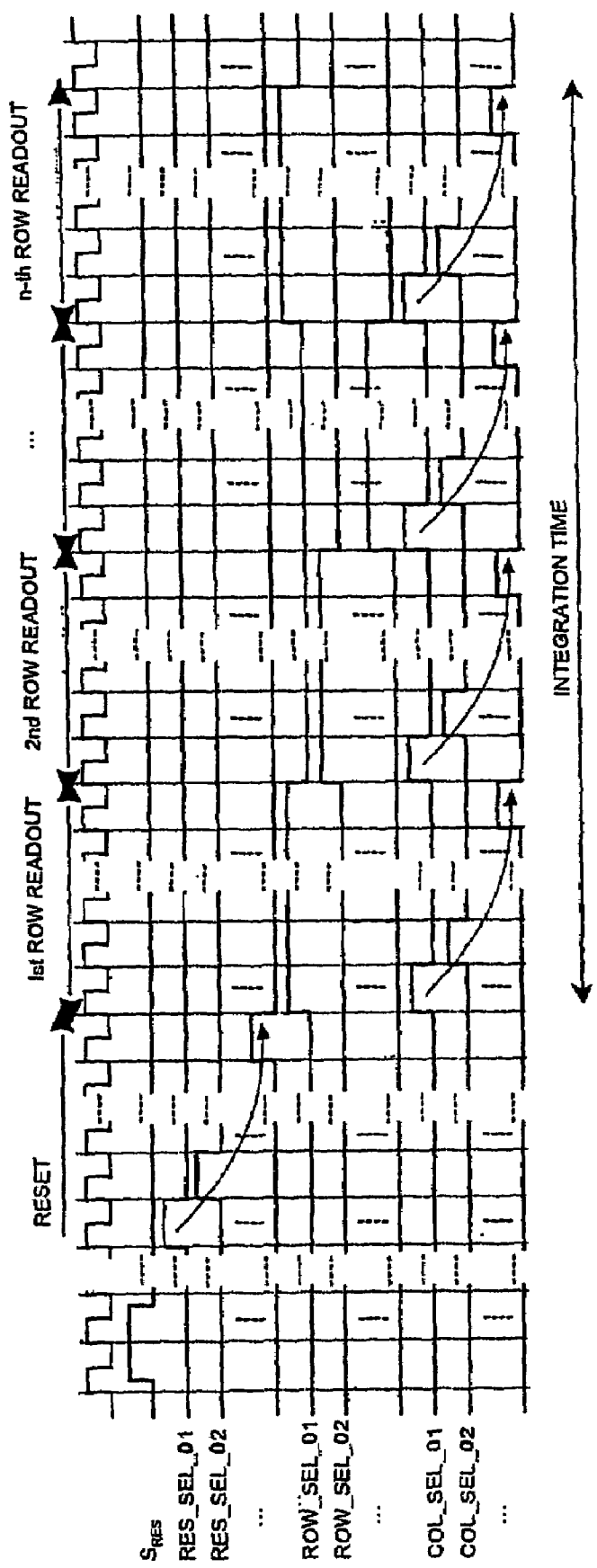
FIG. 4 is a diagram showing a plot of quantities relevant to the dosimeter of FIG. 1.

As shown in FIG. 1, a monolithic active pixel dosimeter 1 comprises a plurality of sensing cells 2, arranged in rows and columns so as to form a sensing array 3, and a reading circuit 5. The reading circuit 5 comprises a row-reset selecting register 6, a column selecting register 7 and a readout amplifier 8. The sensing cells 2 have respective select inputs 2a, reset inputs 2b and current outputs 2c. In detail, the sensing cells 2 arranged in one and the same row have their select inputs 2a and reset inputs 2b connected to the row-reset selecting register 6 respectively through a common row select line 10 and a common reset line 11. The sensing cells 2 arranged in one and the same column have their current outputs 2c connected to a column select line 12. Moreover, the column select lines 12 corresponding to even columns are connected to the readout amplifier 8 through respective first column select transistors 14 and a selector 15, and the column select lines 12 corresponding to odd columns are connected to the readout amplifier 8 through respective second column select transistors 16 and the selector 15. Control terminals of the first and second transistors 14, 16 are connected to the column selecting register 7.

With reference to FIG. 2, each sensing cell 2 comprises a junction sensing element 18, a charge reading transistor 19, a row select transistor 20 and a reset transistor 21. More specifically, the junction sensing element 18 has a first terminal connected to a gate terminal of the charge reading transistor 19 and a second terminal connected to ground. The charge reading transistor 19 has also a drain terminal connected to a supply line 22, which is at a supply voltage $V_A$, and a source terminal, which is connected to the current output 2c of the sensing cell 2 through the row select transistor 20. The reset transistor 21 has conduction terminals connected to the supply line 22 and to the first terminal of the junction sensing element 18. Moreover, gate terminals of the row select transistor 20 and of the reset transistor 21 form the row select input 2a and the reset input 2b of the sensing cell 2, respectively.

As shown in FIG. 3, the junction sensing elements 18 are built in a semiconductor body 24, having a P+ type substrate 25 and an P− type epitaxial layer 26, grown over the substrate 24. Each junction sensing element 18 comprises a sensing region 27 and a charge collecting region 28, contiguous to each other and both embedded in the epitaxial layer 26. In greater detail, the charge collecting region 28 is a N type well extending through lateral P wells 29, housed in the epitaxial layer 26, too; when an inverse bias voltage is set between the epitaxial layer 26 and the charge collecting region 28, the sensing region 27 is depleted of majority carriers, thus enabling radiation detection. In practice, when a radiation beam impinges in the depleted sensing region 27, electron-hole pairs are generated; electrons diffuse within the depleted sensing region 24 and are collected by charge collecting region 2.

The junction sensing element 18 further comprises an ohmic region 30, of N+ type, partially overlapping and extending laterally outside the charge collecting region 28; and an insulating annular region 31, of P+ type, abutting the ohmic region 30, so as to form an insulating PN junction 32 surrounding both the ohmic region 30 and the charge collecting region 28. Moreover, a thick field oxide layer 33 externally delimits the insulating annular region 31 and a thin dielectric film 35 is placed on the insulating PN junction 32. Preferably, the dielectric film 35 has a thickness comprised between 5 nm and 7.5 nm and not exceeding 8 nm.

As already explained, when a radiation beam is adsorbed by the depleted sensing region 27, electron-hole pairs are generated and electrons, after diffusing through the depleted sensing region 27, are collected by the charge collecting region 28. These electrons are accumulated at the gate terminal of the charge reading transistor 19. Accordingly, when the row select transistor 20 is turned on, the accumulated charge modulates a current flowing through the charge reading transistor 19. In practice, the junction sensing element 18 and the charge reading transistor 19 form a pixel detector that detects the radiation impinging in the depleted sensing region 27 and supplies an output current correlated to the adsorbed dose.

Also, during reading operation of the sensing array 3, the row-reset selecting register 6 firstly resets the junction sensing elements 18 by turning on the respective reset transistor 21; then, the row-reset selecting register 6 sequentially selects one row select line 10 at a time, while the column selecting register 7 selects one even and one odd column select line 12. One of the selected column select lines 12 (for example, the even one) is connected to the readout amplifier 8 and a charge signal $S_C$, representative of the charge accumulated at the gate terminal of the corresponding charge reading transistor 19, is supplied on the output terminal 5a of the reading circuit 5. In the meantime, transients, which are associated to selection of the other selected column select line 12 (the odd one, in this case), expire; thus, when the selector 15 switches, the odd selected column select line 12 is ready to be connected to the readout amplifier 8 an no dead time is interposed. FIG. 4 shows a timing diagram relevant to reading operation of the sensing array 3.

It is clear from the above that the dosimeter 1 has advantageously improved radiation tolerance. In fact, the insulating PN junction 32 overcomes the need for thick oxide structures in the vicinity of the junction sensing element 18. In practice, the amount of charge which can be accumulated within the thin dielectric film 35 is negligible and does not affect the efficiency of the junction sensing element 18.

Furthermore, faster readout of the sensing array 3 is possible, due to the structure of the reading circuit 5.

Figure 5:
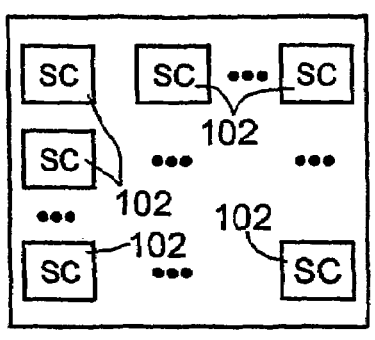
FIG. 5 is a simplified block diagram of a monolithic active pixel dosimeter, according to a second embodiment of the present invention.
Figure 6:
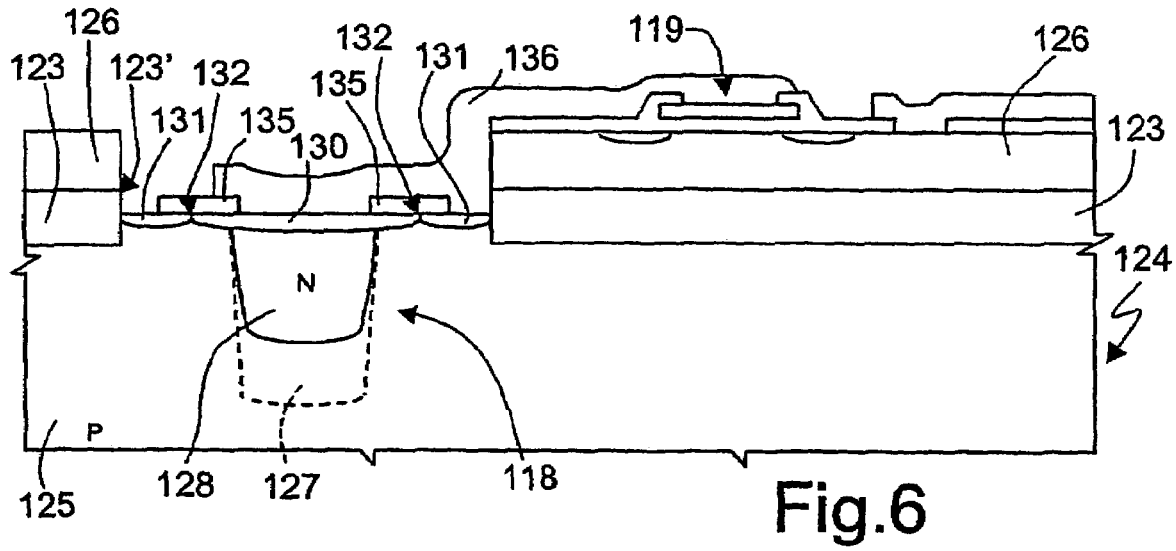
FIG. 6 is a cross section through a semiconductor body housing the dosimeter of FIG. 5.

According to a second embodiment of the invention, illustrated in FIGS. 5 and 6, a dosimeter 100 comprises a plurality of sensing cells 102, which are built in a semiconductor body 124 having a SOI structure. In particular, the semiconductor body 124 comprises a high resistivity substrate 125, of P type, a low resistivity layer 126, of P++ type, and a buried oxide layer 123, interposed between the substrate 125 and the low resistivity layer 126.

A junction sensing element 118, housed in an opening 123' of the buried oxide layer 123, has a depleted sensing region 127, of P type, and a charge collecting region 128, of N type, contiguous to each other and both embedded in the high resistivity substrate 125. The junction sensing element 118 further comprises an ohmic region 130, of N+ type, partially overlapping and extending laterally outside the charge collecting region 128; and an insulating annular region 131, of P+ type, abutting the ohmic region 130, so as to form an insulating PN junction 132 surrounding both the ohmic region 130 and the charge collecting region 128. Moreover, the buried oxide layer 123 externally delimits the insulating annular region 131 and a thin dielectric film 135 is placed on the insulating PN junction 132.

The low resistivity layer 126 houses also circuital components forming the sensing cell 102 and a reading circuit, similar to the reading circuit 5 of FIG. 1 and here not illustrated. Moreover, the sensing cell 102 is similar to the sensing cell 2 of FIG. 2 and comprises a charge reading transistor 119, which forms a pixel detector with the junction sensing element 118, a row select transistor and a reset transistor; anyway, for the sake of simplicity, FIG. 6 shows only the charge reading transistor 119 and a connection line 136 connecting the ohmic region 130 to the gate terminal of the charge reading transistor 119.

According to the above describe second embodiment, the depleted sensing region 127 extends within a high resistivity substrate and therefore its depth is much greater than sensing regions embedded in low resistivity epitaxial layers; for example, the depleted sensing region 127 can be 300 to 500 microns deep. It is clear that such dimensions considerably improve the detecting efficiency of the sensing cells and of the dosimeter. In other words, the increase of the dimension leads to comparatively higher readout signals.

Figure 9:
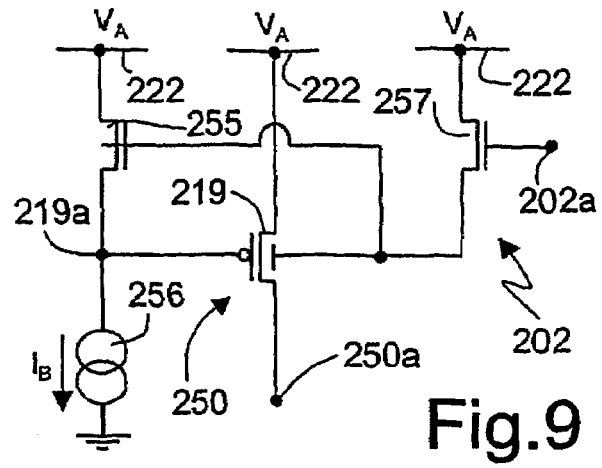
FIG. 9 is a circuit diagram of a part of the block diagram of FIG. 7.
Figure 8:
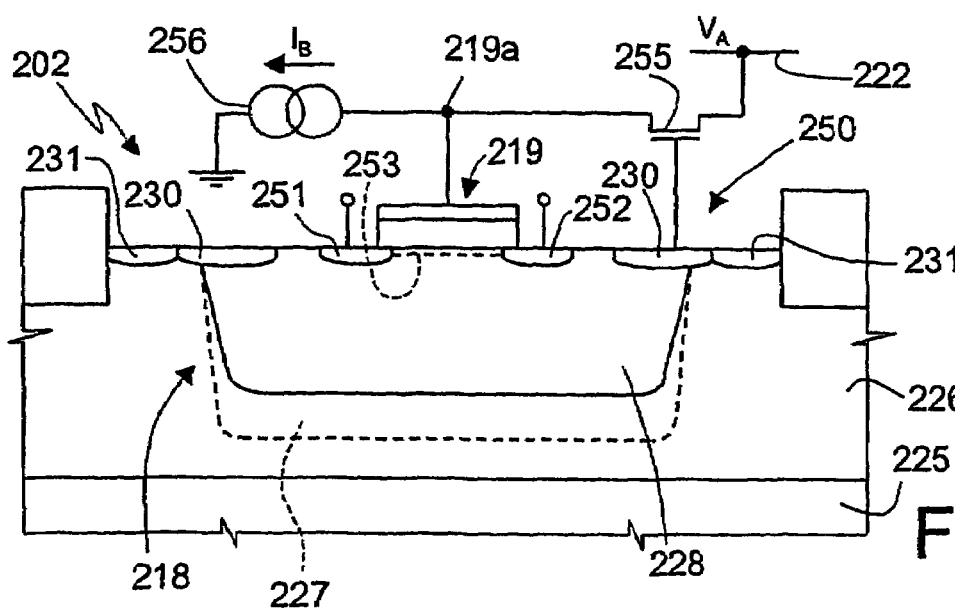
FIG. 8 is a cross section through a semiconductor body housing the dosimeter of FIG. 7.
Figure 7:
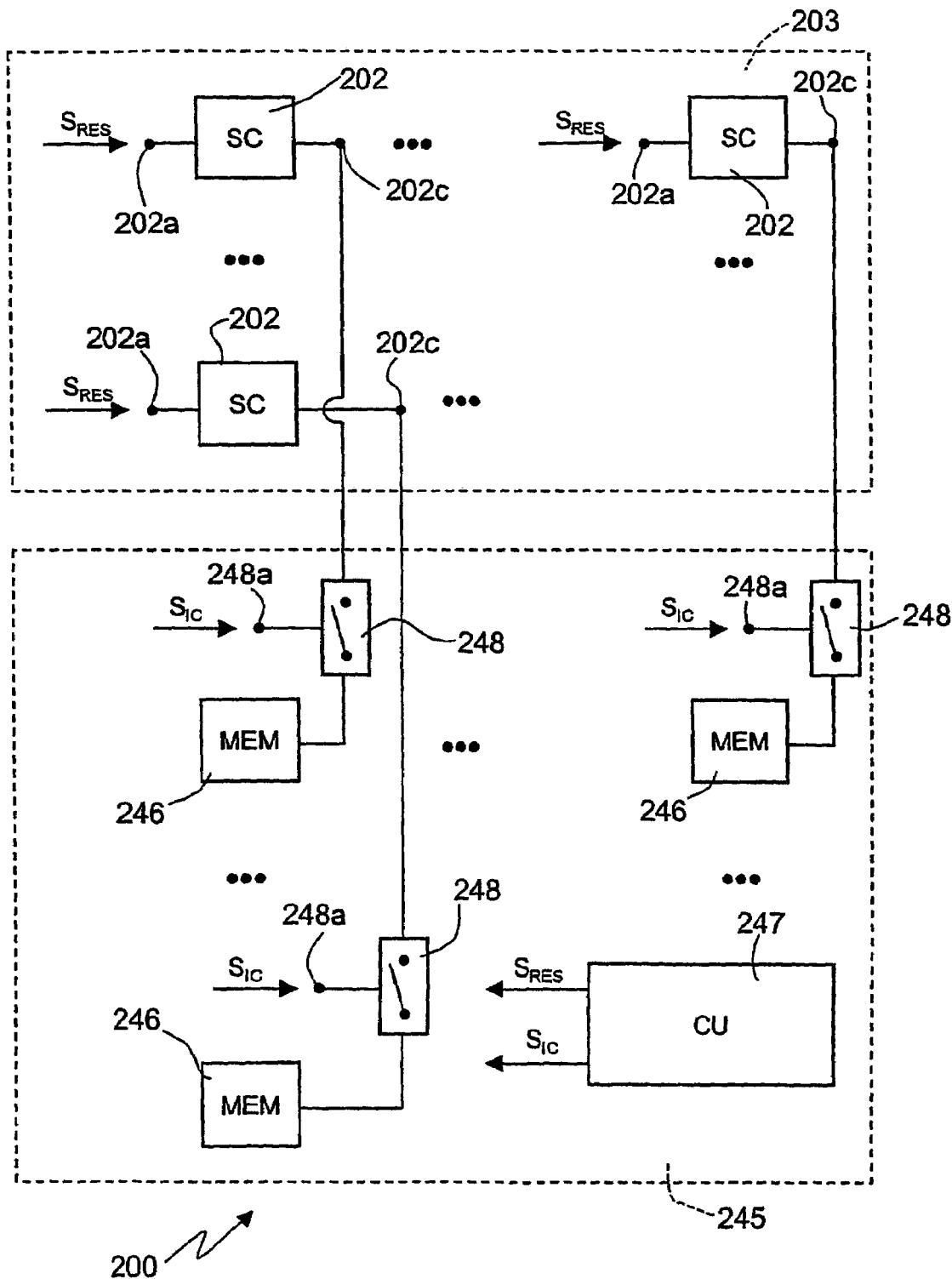
FIG. 7 is a simplified block diagram of a monolithic active pixel dosimeter, according to a third embodiment of the present invention.

With reference to FIGS. 7 to 9, a third embodiment of the present invention will be described hereinafter. A dosimeter 200 comprises a plurality of sensing cells 202, arranged in rows and columns so as to form a sensing array 203, and an integration control circuit 245, comprising a plurality of analogue memory cells 246 and a control unit 247. The sensing cells 202 have output terminals 202a connected to respective memory cells 246 through respective switches 248; preferably, the sensing cells 202 have also reset input terminals 202a receiving a reset signal $S_{RES}$, supplied in a known manner by the control unit 247. The switches 248 have respective control terminals 248a, receiving an integration control signal $S_{IC}$, also supplied by the control unit 247. Accordingly, the switches 248 are simultaneously controlled by the control unit 247. A memory reading circuit, of a known type and here not illustrated, enables selectively addressing and reading the memory cells 246.

In practice, integration control circuit 245 acts as a global shutter. In fact, the control unit 247 resets the sensing cells 202 and, when a predetermined integration time has elapsed, causes the switches 248 to close, thus connecting the sensing cells 202 to the respective memory cells 246. In a known manner, electric quantities are thus simultaneously stored in the memory cells 246 (e.g. a voltages). In particular, the stored electric quantities are correlated to output currents of the sensing cells 202, which, in turn, depend on the charge accumulated in the charge collecting region 228 during the integration time and, therefore, on the adsorbed dose. Advantageously, the integration time can be easily and precisely controlled through the integration control circuit 245, and is uniform for all the sensing cells 202.

As illustrated in FIGS. 8 and 9, each sensing cell 202 is provided with a respective pixel detector 250. In detail, the pixel detector 250 is built in a semiconductor body 224 havng a substrate 225, of P+ type, and an epitaxial layer 226, of P− type, grown on the substrate 225. Fuerthermore, the pixel detector 250 comprises a junction sensing element 218, having a depleted sensing region 227 of P type and a charge collecting region 228 of N type, and a charge reading transistor 219 coupled to the junction sensing element 218. In detail, the charge reading transistor 219, which is a P type photoFET, has a source region 251 and a drain region 252 embedded in the charge collecting region 228; a channel region 253 of the charge reading transistor extends between the source region 251 and the drain region 252. Moreover, a source terminal and a drain terminal of the charge reading transistor 219 are respectively connected to an output terminal 250a of the pixel detector 250 and to a supply line 222 (see FIG. 9). An ohmic region 230, partially overlapping and extending laterally outside the charge collecting region 228, is connected to a control terminal 219a of the charge reading transistor 219 through a source follower transistor 255, which is only schematically shown in FIG. 8. Moreover, an annular insulating region 231, of P+ type, abuts the ohmic region 230, so as to form an insulating PN junction 232, surrounding both the ohmic region 230 and the charge collecting region 228. The source follower transistor 255 is a NMOS transistor having a source terminal connected to the control terminal 219a of the charge reading transistor 219, a drain terminal connected to a supply line 222, and a gate terminal connected to the ohmic region 230. A programmable current generator 256, supplying a controlled bias current $I_B$, is connected between the source terminal of the source follower transistor 255 and ground.

Since the bias current $I_B$ flows through the source follower transistor 255, a constant voltage is applied between its gate and source terminals. Hence, a substantially equal bias voltage $V_B$ exists between the control terminal 219a of the charge reading transistor 219 and the charge collecting region 218 (in particular, the channel region 253). In practice, the source follower transistor 255 is operated as a voltage regulator for maintaining the bias voltage $V_B$ between the charge collecting region 228 and the control terminal 219a of the charge reading transistor 219 at least at a predetermined value. The charge reading transistor 219 is consequently biased in a high transconductance state and is on. Electrons generated in the sensing region 227 by impinging radiation and collected by the charge collecting region 228 modulate the bias voltage $V_B$ and the current flowing through the charge reading transistor 219. In particular, the output current characteristic of the charge reading transistor 219 exhibit nonlinear dependence on the current of charge carriers generated by a continuous impinging radiation beam, when operated in strong inversion, and becomes nearly linear when operated in weak inversion.

The above described pixel detector advantageously exhibits much higher sensitivity and better noise performance than standard charge collecting diodes and classical pixel architecture based on 3 transistor design. The electron-hole pairs generated by the impinging radiation affect the threshold voltage of the charge reading transistor 219, and hence, modulate its output current. Modulation of the transistor current causes signal amplification, resulting in conversion of the generated charge to current.

Figure 10:
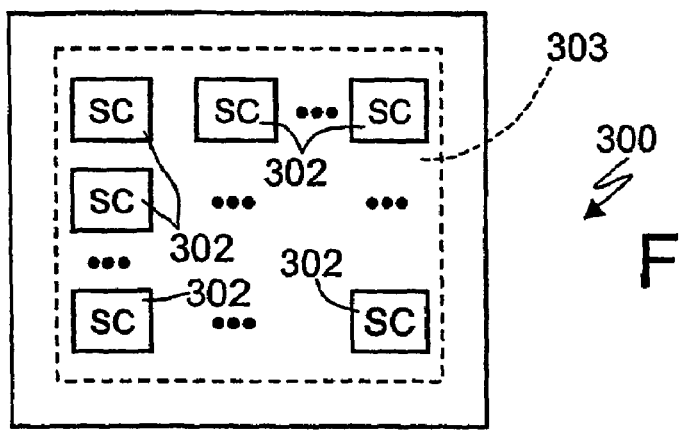
FIG. 10 is a simplified block diagram of a monolithic active pixel dosimeter, according to a fourth embodiment of the present invention.
Figure 11:
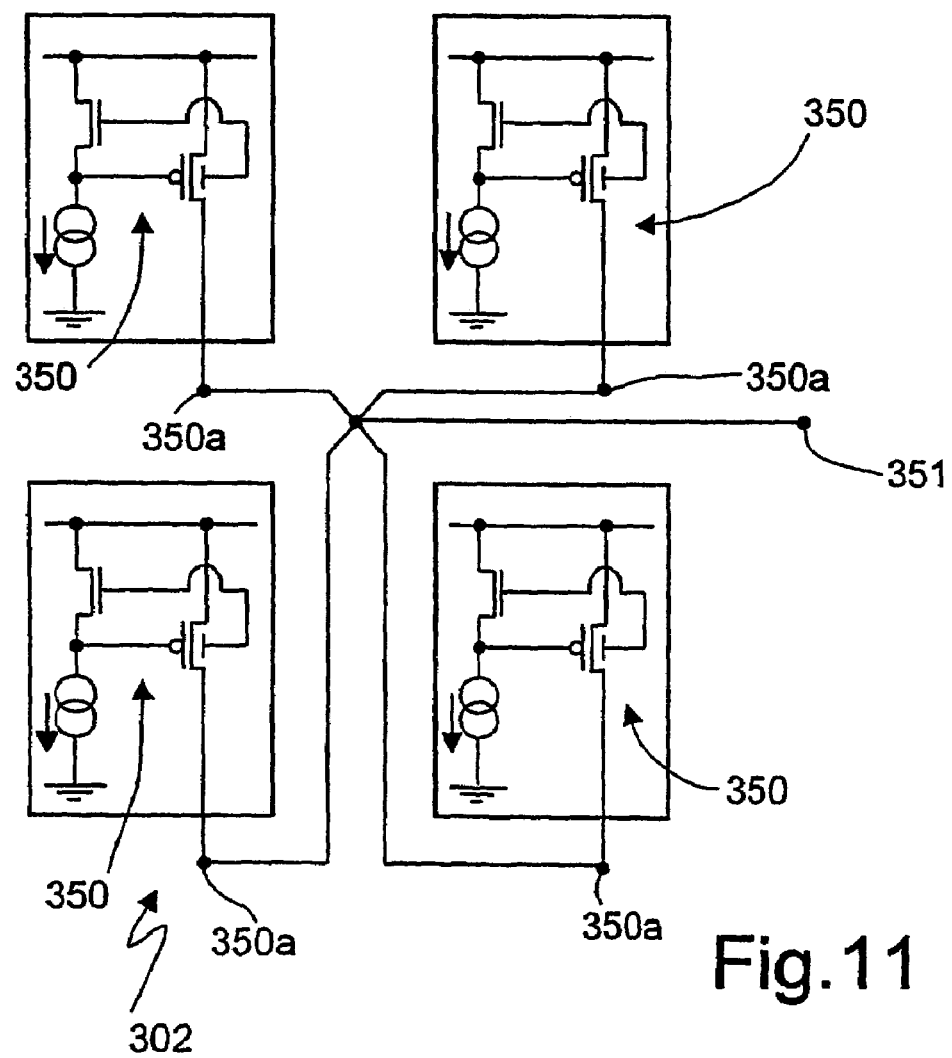
FIG. 11 is a circuit diagram of a part of the block diagram of FIG. 10.

According to a fourth embodiment, which is illustrated in FIGS. 10 and 11, a dosimeter 300 comprises a plurality of sensing cells 302, arranged in rows and columns so as to form a sensing array 303. Each sensing cell 302 comprises a predetermined number of adjacent pixel detectors 350 (four, in this case), preferably having the same structure as the pixel detectors 250 of FIG. 9. Output terminals 350a of the pixel detectors 350 are all connected to a current summing node 351, which forms an output terminal of the sensing cell 302. Output terminals 350a can also be connected to the current summing node 351 through respective current mirror circuits 352, as shown in FIG. 12. Accordingly, the output current of the sensing cell 302 is equal to the sum of the output currents of the individual pixel detectors 350.

FIGS. 13 and 14 show a fifth embodiment of the invention. In this case, a dosimeter 400 comprises a plurality of sensing cells 402, each comprising four adjacent pixel detectors 450. In each sensing cell 402, the pixel detectors 450 comprise respective L-shaped junction sensing elements 418 and contiguous readout areas 451, as shown in the top view of FIG. 14. An annular well 452 of N type surrounds the readout areas 451 (of P type) so as to form a guard ring which laterally insulates the readout areas 451 and prevents electrons generated by the radiation impinging in the junction sensing elements 418 to be collected by the readout areas 451.

Figure 15:
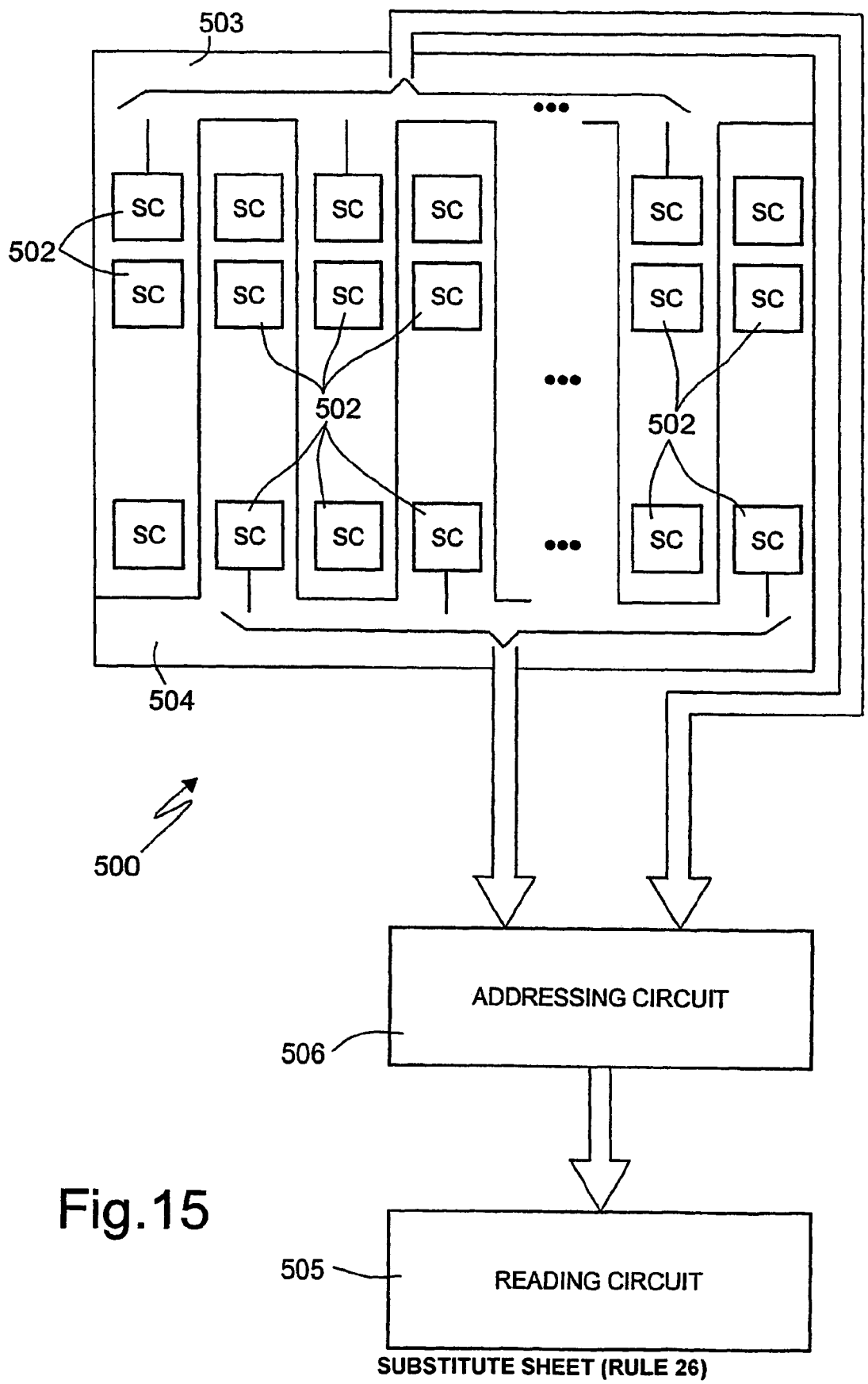
FIG. 15 is a simplified block diagram of a monolithic active pixel dosimeter, according to a sixth embodiment of the present invention.

According to a sixth embodiment, illustrated in FIG. 15, a dosimeter 500 comprises a plurality of sensing cells 502, having the same structure of the sensing cells of FIG. 2, a reading circuit 505 and an addressing circuit 506. The sensing cells 502 are arranged in first sensing array 503 and in a second sensing array 504, interleaved with the first sensing array 503. The addressing circuit 506 alternatively connects the first or the second sensing array 503, 504 to the reading circuit 505. More particularly, in a first operative condition, the sensing cells 502 of the first sensing array 503 accumulate charge generated by impinging radiation (integration step); in the meantime, the sensing cells 502 of the second sensing array 504 are connected to the reading circuit 505 (reading step). In a second operative condition, non-overlapping with the first operative condition, the addressing circuit 506 connects the sensing cells 502 of the first sensing array 503 to the reading circuit 505, while the sensing cells 502 of the second sensing array start the integration step.

The above described embodiment of the invention eliminates the dead times which affect single-array dosimeters and are caused by the necessity to alternate the integration step and the reading step.

Finally, it is clear that numerous modifications and variations may be made to the monolithic active pixel dosimeter described and illustrated herein, all falling within the scope of the inventive idea, as defined in the attached claims.

For example, a dosimeter could comprise two or more memory cells for each sensing cell. In this manner, it is possible to store a plurality of electric quantities correlated to the charge accumulated (i.e. to the adsorbed dose) at subsequent times of the integration step.

What is claimed is:

1. A monolithic active pixel dosimeter, comprising at least a sensing cell, having at least a junction sensing element, said junction sensing element comprising:
   a sensing region, having a first type of conductivity; and
   a charge collecting region, contiguous to said sensing region and having a second type of conductivity;
   characterized in that said sensing cell comprises:
   an ohmic region, arranged on and in contact with said charge collecting region, at least partially overlapping said charge collecting region and extending laterally outside said charge collecting region; and
   an insulating annular region, abutting said ohmic region so as to form an insulating junction surrounding said ohmic region and said charge collecting region.

2. A dosimeter according to claim 1, characterized in that said ohmic region has said second type of conductivity and said insulating annular region has said first type of conductivity.

3. A dosimeter according to claim 1, characterized by comprising a dielectric film, placed on said insulating junction.

4. A dosimeter according to claim 3, characterized in that said dielectric film has a thickness comprised between 5 nm and 7.5 nm.

5. A dosimeter according to claim 1, characterized in that said sensing region and said charge collecting region are embedded in a first conductive layer.

6. A dosimeter according to claim 5, characterized in that said first conductive layer is an epitaxial layer.

7. A dosimeter according to claim 5, characterized in that said first conductive layer is a high resistivity substrate of a SOI structure.

8. A dosimeter according to claim 7, characterized by comprising circuit means coupled to said sensing cell and embedded in a second conductive layer.

9. A dosimeter according to claim 8, characterized in that said second conductive layer is a low resistivity layer of said SOI structure.

10. A dosimeter according to claim 1, characterized in that said sensing cell comprises at least one pixel detector.

11. A dosimeter according to claim 10, characterized in that said pixel detector comprises a charge reading transistor, coupled to said junction sensing element.

12. A dosimeter according to claim 11, characterized in that said charge reading transistor is at least partially embedded in said charge collecting region.

13. A dosimeter according to claim 12, characterized in that said charge reading transistor has a first and a second conduction region sunk in said charge collecting region.

14. A dosimeter according to claim 12, characterized in that said pixel detector comprises voltage regulating means coupled to said charge collecting region and to said charge reading transistor for regulating a voltage between said charge collecting region and a control terminal of said charge reading transistor.

15. A dosimeter according to claim 14, characterized in that said voltage regulating means comprise a source follower transistor having a gate terminal connected to said charge collecting region and a source terminal connected to said control terminal of said charge reading transistor.

16. A dosimeter according to claim 15, characterized in that said voltage regulating means comprise a programmable current generator supplying a controlled current to said source follower transistor.

17. A dosimeter according to claim 10, characterized in that said sensing cell comprises a predetermined number of said pixel detectors, adjacent to one another, and a current summing node, connected to respective output terminals of said pixel detectors.

18. A dosimeter according to claim 17, characterized in that said integration control circuit comprises a plurality of analogue memory cells, selectively connectable to output terminals of respective said sensing cells, and connecting means for simultaneously connecting said analogue memory cells to said sensing cells.

19. A dosimeter according to claim 18, characterized in that said connecting means comprise a plurality of simultaneously controllable switches, each switch being coupled to a respective sensing cell.

20. A dosimeter according to claim 10, characterized by comprising a plurality of said sensing cells.

21. A dosimeter according to claim 20, characterized by comprising an integration control circuit for controlling an integration time of said sensing cells.

22. A dosimeter according to claim 20, characterized in that said sensing cells are arranged in at least a first array.

23. A dosimeter according to claim 22, characterized in that said sensing cells are arranged in said first array and in a second array, interleaved with said first array.

24. A monolithic active pixel dosimeter, comprising at least a sensing cell, having at least a junction sensing element, said junction sensing element comprising:
    a sensing region, having a first type of conductivity; and
    a charge collecting region, contiguous to said sensing region and having a second type of conductivity;
    characterized in that said sensing cell comprises:
        an ohmic region, arranged on and in contact with said charge collecting region, at least overlapping said charge collecting region and extending laterally outside said charge collecting region; and
        an insulating annular region, abutting said ohmic region so as to form an insulating junction surrounding said ohmic region and said charge collecting region;
    further characterized in that said sensing cell comprises at least one pixel detector;
    further characterized by comprising a plurality of said sensing cells arranged in at least a first array and in a second array, interleaved with said first array; and
    further characterized by comprising a reading circuit and an addressing circuit, for alternatively connecting said sensing cells of said first array and said sensing cells of said second array to said reading circuit.

25. A dosimeter according to claim 24, characterized in that said sensing cells of said first array are connected to said reading circuit in a first operative condition and said sensing cells of said second array are connected to said reading circuit in a second operative condition, non-overlapping with said first operative condition.

26. An active pixel array, comprising:
    at least a sensing cell, having at least a junction sensing element, said junction sensing element including:
        a sensing region, having a first type of conductivity; and
        a charge collecting region, contiguous to said sensing region and having a second type of conductivity;
    characterized in that said sensing cell comprises:
        an ohmic region, arranged on and in contact with said charge collecting region, at least partially overlapping said charge collecting region and extending laterally outside said charge collecting region; and
        an insulating annular region, abutting said ohmic region so as to form an insulating junction surrounding said ohmic region and said charge collecting region.

27. The active pixel array of claim 26, further comprising:
    at least one pixel detector;
    a plurality of said sensing cells arranged in at least a first array and in a second array, interleaved with said first array; and
    a reading circuit and an addressing circuit, for alternatively connecting said sensing cells of said first array and said sensing cells of said second array to said reading circuit.

28. The active pixel array of claim 27, where said sensing cells of said first array are connected to said reading circuit in a first operative condition and said sensing cells of said second array are connected to said circuit in a second operative condition, non-overlapping with said first operative condition.

* * * * *

UNITED STATES PATENT AND TRADEMARK OFFICE
CERTIFICATE OF CORRECTION

| | | |
|---|---|---|
| PATENT NO. | : 7,582,875 B2 | Page 1 of 1 |
| APPLICATION NO. | : 11/123708 | |
| DATED | : September 1, 2009 | |
| INVENTOR(S) | : Massimo Caccia et al. | |

It is certified that error appears in the above-identified patent and that said Letters Patent is hereby corrected as shown below:

Title page, item [75] the 22nd named Inventor's name is "Ornella Ferrando"

Title page, item [73] the second named applicant is "Akademia Gorniczo-Hutnicza".

Title page, item (*) Notice: should read as follows: Subject to any disclaimer, the term of this patent is extended or adjusted under 35 U.S.C. 154(b) by 1031 days.

Signed and Sealed this

Twenty-seventh Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,582,875 B2 Page 1 of 1
APPLICATION NO. : 11/123708
DATED : September 1, 2009
INVENTOR(S) : Caccia et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1031 days.

Signed and Sealed this

Fourteenth Day of September, 2010

David J. Kappos
*Director of the United States Patent and Trademark Office*